United States Patent [19]

Boord et al.

[11] 4,252,838
[45] Feb. 24, 1981

[54] GLOW DISCHARGE FABRICATION OF TRANSPARENT CONDUCTIVE COATINGS

[75] Inventors: Warren T. Boord, Hennepin; Anthony R. Lefkow; Henry Y. B. Mar, both of Ramsey, all of Minn.

[73] Assignee: Honeywell Inc., Minneapolis, Minn.

[21] Appl. No.: 941,346

[22] Filed: Sep. 11, 1978

[51] Int. Cl.³ .............................................. B05D 3/06
[52] U.S. Cl. ...................... 427/40; 427/109; 427/162; 427/164; 427/166
[58] Field of Search ..................... 427/38, 39, 40, 162, 427/109, 166, 248 C, 164; 350/61, 66; 204/164

[56] References Cited

U.S. PATENT DOCUMENTS

| 3,108,900 | 10/1963 | Papp | 427/39 |
| 3,243,363 | 3/1966 | Helwig | 427/39 |
| 3,424,661 | 1/1969 | Androshuk | 427/39 |
| 3,458,342 | 7/1969 | Cormia | 427/166 |
| 3,586,533 | 6/1971 | Cubert et al. | 427/39 |
| 3,991,228 | 11/1976 | Carlson et al. | 427/39 |
| 4,038,439 | 7/1977 | Gibson et al. | 427/38 |

FOREIGN PATENT DOCUMENTS

| 47-14600 | 5/1972 | Japan | 427/109 |
| 1266452 | 3/1972 | United Kingdom | 427/40 |

OTHER PUBLICATIONS

Boord et al., Technical Report AFML-TR-76-116, pp. 14, 15 and 39-46, Jul. 1976.
Air Force Materials Laboratory, Nonmetallic Materials Division, Elastomers and Coatings Branch, AFML/MBE, Wright-Patterson AFB, Ohio 45433.

Primary Examiner—John H. Newsome
Attorney, Agent, or Firm—Charles G. Mersereau

[57] ABSTRACT

Optically transparent, conducting metal oxide films are produced on plastic or suitable ceramic substrates by placing the substrate to be coated in a partially evacuated chamber containing a mixture of a suitable organometallic compound vapor and oxygen and utilizing a glow discharge sustained by a DC, AC or RF electromagnetic field.

5 Claims, 2 Drawing Figures

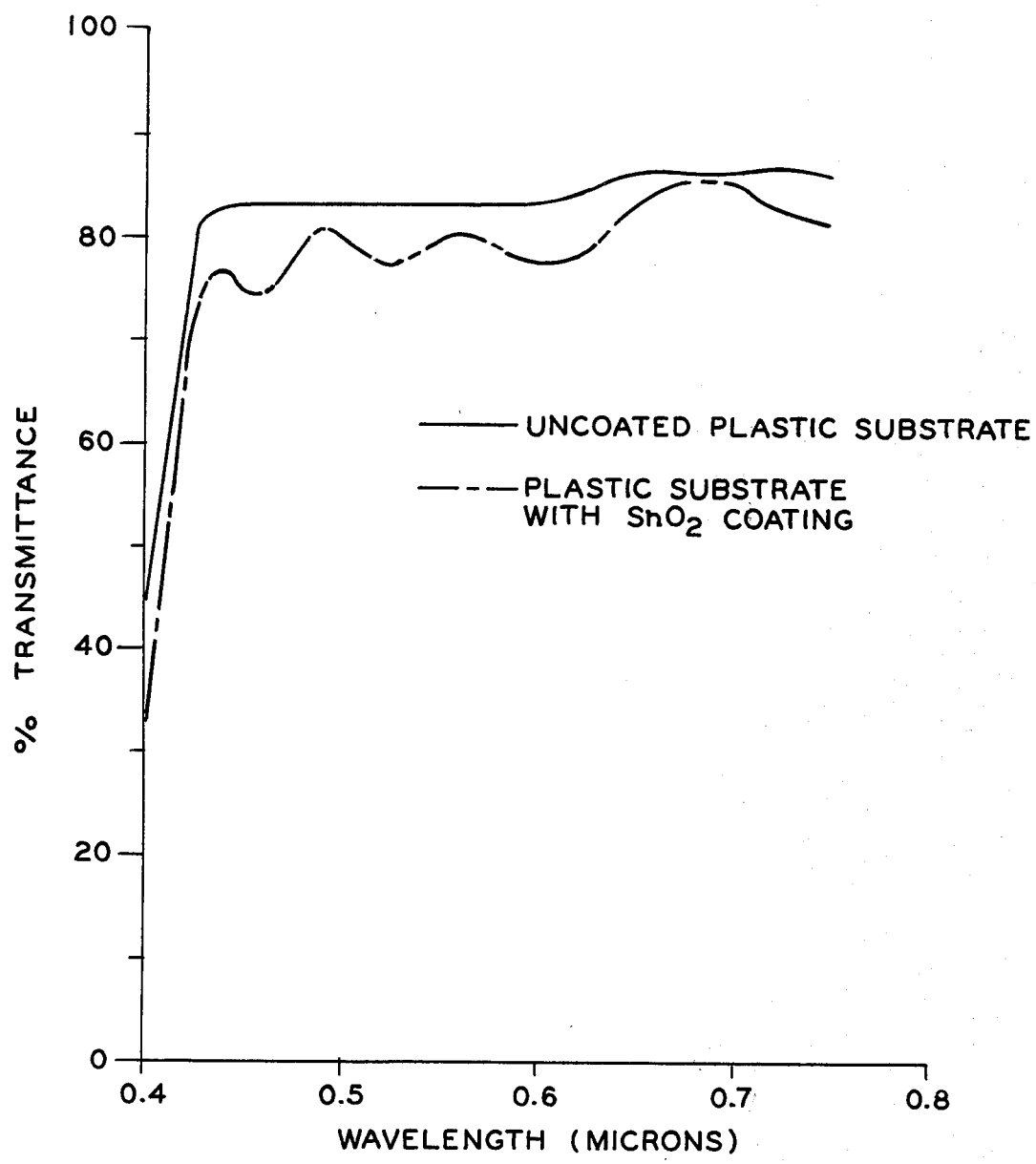

GLOW DISCHARGE FABRICATION OF TRANSPARENT CONDUCTIVE COATINGS

The invention herein described was made in the course of or under a contract or subcontract with the Department of the Air Force.

BACKGROUND OF THE INVENTION

1. Field of the Invention

The present invention relates generally to a method of producing visibly transparent conductive coatings, substantially optically transparent, on substrates at low temperature and, more particularly, to a method of producing transparent conductive coatings of metal oxides on plastic materials by the utilization of a glow discharge process.

2. Description of the Prior Art

In the prior art, metallic oxide layers have been produced on a variety of substrates by several techniques including vacuum evaporation. However, this type of process requires a high temperature, high vacuum environment which necessitates expensive precision equipment and cannot be used to coat plastic substrates simply because the substrates cannot survive the process. Another technique involving cathode sputtering has been used. This too is an expensive method requiring a great deal of input energy and considerable time to achieve a reasonable layer thickness.

The use of some organo-metallic compounds to provide the metal component of a desired coating utilizing low pressure glow discharge to activate the monomer is generally disclosed in the prior art. U.S. Pat. No. 3,243,363 to Helwig, issued Mar. 29, 1966, shows the use of compounds such as tetraethyl lead $Pb(C_2H_5)_4$ and silicium hexamethyl $(H_3)_3.Si-Si.(CH_3)_3$ in a two-electrode glow discharge system to plate a metallic layer on the substrate and the use of metallic carbonyl compounds such as iron pentacarbonyl $Fe(CO)_5$ and nickel tetracarbonyl $Ni(CO)_4$ to deposit a dielectric layer of the oxide of the carbonyl-forming metal on a selected substrate. That reference, however, is limited to the deposition of metal and dielectric films used generally for the production of capacitance devices.

SUMMARY OF THE INVENTION

By means of the present invention, it has been discovered that electrically conductive, optically transparent, metal oxide semiconducting films may be deposited on plastic or other suitable substrates without substrate preheating or excessive substrate heating during deposition. The substrate to be coated is placed into a glow discharge environment which is sustained in a partial vacuum containing a mixture of a suitable organo-metallic compound vapor and oxygen using a DC, AC or RF electromagnetic field. Using a tetraethyltin or tetramethyltin-oxygen mixture, optically transparent, conducting $SnO_2$ films have been produced on blank substrates with a film growth rate of 200 Å per minute.

BRIEF DESCRIPTION OF THE DRAWINGS

In the drawings, wherein like numerals are utilized to designate like parts throughout the same:

FIG. 2 is a comparison graph showing the percent transmission versus certain wave lengths of a transparent plastic substrate by itself and also coated in accordance with the invention.

DESCRIPTION OF THE PREFERRED EMBODIMENT

Figure 1:
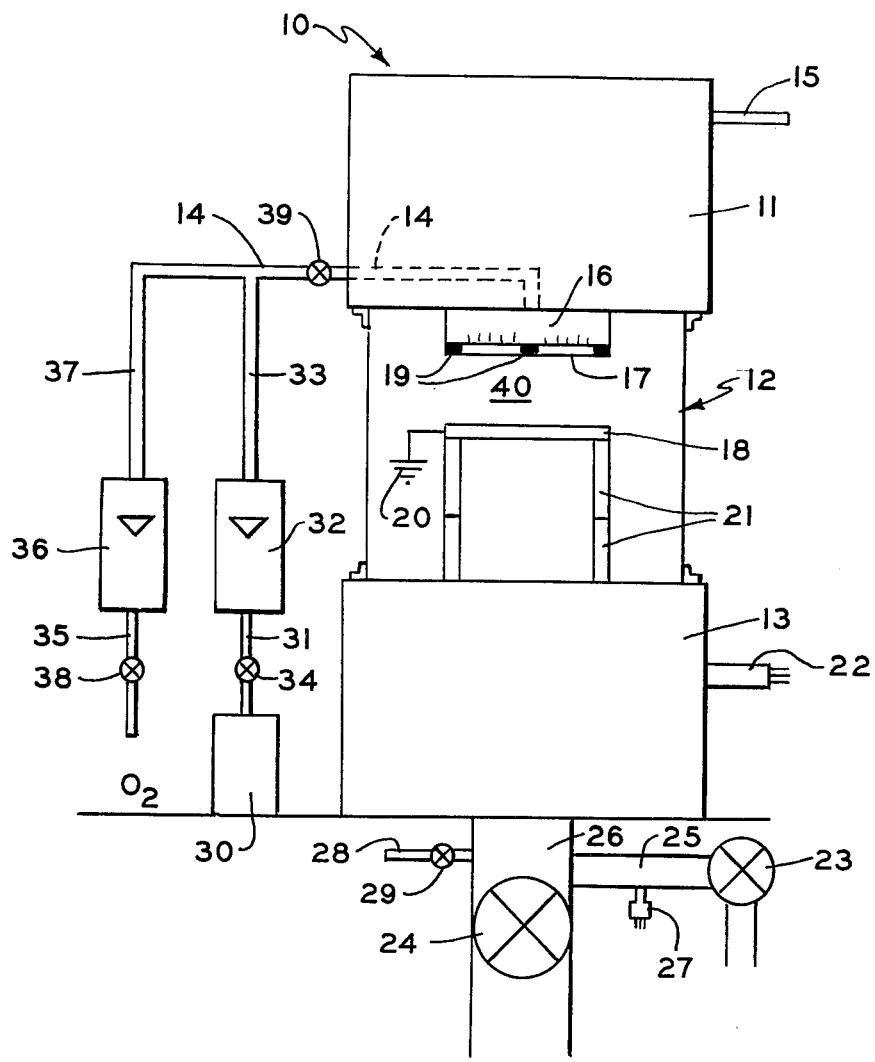
FIG. 1 is a side elevational view of an apparatus utilized to produce the coatings of the invention.

Turning now to the drawings and in particular to FIG. 1 thereof, there is shown generally at 10 an apparatus for carrying out the coating process in accordance with the invention. The apparatus includes a vacuum chamber having an inlet section 11, a coating section 12 and an outlet section 13. The section 11 includes a process gas inlet 14, a radio frequency inlet 15 and the conventional necessary radio frequency matching network not shown.

The glow discharge processing section 12 includes a process gas diffuser 16, a glow discharge cathode 17 and a suitable substrate table or surface on which the object to be coated is placed 18. The cathode 17 is separated from the gas diffuser 16 by means of suitable ceramic insulators 19. The substrate table is suitably grounded as at 20 and insulated from the system as by other suitable ceramic insulators 21. The outlet section 13 contains an ionization gauge tube shown in part at 22 which is utilized to measure the pressure in the chamber itself. A partial vacuum is achieved and maintained on the system by means of a conventional rough pump 23 which is operated in conjunction with a larger diffusion pump illustrated at 24 to evacuate and control pressure in the chamber through conduits 25 and 26 respectively. A thermocouple gauge 27 is also provided. An inlet tube 28 suitably valved at 29 is provided to admit air into the chamber after completion of coating process.

The process gas inlet system includes a chamber 30 for containing the organo-metallic compound, for example, $Sn(CH_3)_4$. This chamber is connected with the inlet 14, as through a tube 31, flow meter 32 and tube 33. The rate of flow of the organo-metallic vapor from the chamber 30 through the flow meter 32 is controlled as by a valve 34. Likewise, a source of oxygen is provided to the inlet tube 14 as from a tank of compressed gas (not shown) which is conducted through a tube 35, flow meter 36 and tube 37 where it is blended with the organo-metallic compound in the tube 14. The flow through the flow meter 36 is also controlled as by suitable valving at 38. The total flow shut-off valve 39 is also provided at the inlet of the vacuum chamber section 11.

In operation, the chamber 12 is opened as by separating portions 12 and 13 and the substrate to be coated which may be, for example, a sheet of Lexan (Trademark of the General Electric Company, Schenectady, New York) plastic that is placed on the substrate table and the system again closed. The pumps 23 and 24 are then started and the system evacuated to the desired point as determined by the ionization gauge tube 22. The flow of the organo-metallic compound from the chambers 30 and the oxygen is begun by opening valves 34, 38, and 39. The relative flow through meters 32 and 36 is adjusted by means of the valves 34 and 38, respectively, until the desired relative flow rates of both the oxygen and the organo-metallic compound is established. The total overall flow rate may then be controlled by modulating the valve 39 to the inlet of the gas diffuser 16. After sufficient time has elapsed such that the chamber is purged of air and contains the desired mixture of the organo-metallic compound and oxygen, the RF input is turned on and the proper glow discharge is activated in the glow discharge region 40. The electrical discharge thereby established the purpose of either breaking apart or ionizing the vapor molecules. The active species then deposit and interact on the surface of the substrate being coated. The deposition rate of the metal oxide on the substrate has been found to be a function of the RF power dissipated in the glow discharge and the pressures of oxygen in the organometallic compound in the chamber. Examples of the deposition of the semiconducting metal oxide films in accordance with the present invention are contained in the illustrations below.

ILLUSTRATION 1

A substrate consisting of an 0.125 inch thick film of the polycarbonate synthetic resin Lexan placed on the substrate table. The system was closed, and the pumps 23 and 24 started to evacuate the system. A mixture of $Sn(CH_3)_4$ and $O_2$ was introduced to the chamber at a $O_2/Sn(CH_3)_4$ partial pressure ratio of 2:1. The desired deposition pressure of 70 m torr. was then established. After stabilization of the condition, the RF glow discharge system was activated utilizing an RF input power of 55 watts and an RF frequency of 13.56 MHz. The deposition time utilized was 1 hour at an electrode spacing of 1.5 inches.

The above process produced a coating of $SnO_2$ having a thickness of 1.07 microns on the substrate. The surface resistance of the coated substrate was measured to be 130 $\Omega/\square$ yielding a coating resistivity of $1.39 \times 10^{-2}$ $\Omega$-cm. The light transmittance of the coated substrate was excellent comparing favorably with that shown in FIG. 2.

ILLUSTRATION 2

The process of illustration 1 was repeated utilizing a substrate of the partially transparent polyimide Kapton (trademark of the duPont Company, Wilmington, Delaware) and an RF input of 35 watts. The electrode spacing was 2.0 inches. This also produced a coating having a surface resistance of 130 $\Omega/\square$ and similar clear optical properties although the precise coating thickness and coating resistivity were not measured.

Other optically transparent, electrically conductive films were coated on plastics such as those used in example illustrations 1 and 2 utilizing an oxygen-tetraethyltin $(C_2H_5)_4Sn$ and tri-n-butyltin methoxide $(C_4H_9)_3SnOCH_3$. These mixtures also produced successful optically transparent, electrical conducting film on substrate similar to those of illustrations 1 and 2, however, properties of those films were somewhat less desirable than those of the ones utilizing tetramethyltin.

Other samples were run utilizing a mixture of oxygen and tri-n-butyltin oxide $[(C_4H_9)_3Sn]_2O$. While these films have similar optical properties, they turned out to be electrically insulating.

Of the organo-metallic compounds studied, tetraethyltin and tetramethyltin, which have the highest vapor pressures of materials utilized, yielded the most uniform films. The deposition rate as a function of the small RF power (<60 watts) dissipated in the glow discharge and the pressures of oxygen and tetramethyltin or tetraethyltin used resulted in the conducting tin oxide film growth rates of approximately 200 Å/minute. This is about 3 times as fast a rate as sputtering, for example, from an indium oxide-tin oxide target at 100 watts power. It can readily be seen that by using the method of the present invention, much faster growth rates are possible at a savings in power consumption.

The $SnO_2$ films deposited by the glow discharge process of the present invention utilizing the activation of tetramethyltin especially are extremely clear. As previously described, FIG. 2 shows the visible transmission of a typical $SnO_2$ coated and uncoated polycarbonate film. The decrease in transmission of the polycarbonate after coating with $SnO_2$ is mainly due to increased reflection losses and not to any decrease in transmission through the film generally.

It may be noted that the surface resistance of the $SnO_2$ film presented by Illustrations 1 and 2 was approximately 130 $\Omega/\square$. Other similar films tested after other similar experiments also produced tin oxide films having a surface resistance in the 100 to 200 $\Omega/\square$ range. It has been found that such films can be reproducibly fabricated on various types of plastic substrates with no damage to the substrate by heating. Thus, during Illustrations 1 and 2 and the other experiments concerning the deposition of films of the present invention, the substrate remained essentially at the ambient temperature of the system (very close to room temperature) during the entire deposition process.

While it is noted that the above examples and discussion have been limited to a few such compounds, organo-metallic compounds of other materials that form transparent conductive oxides should also consider suitable monomers. Thus, organo-metallic compounds of other elements such as indium, cadmium, and rhenium should also provide suitable monomers because, as tin, they too are known to form transparent conductive oxides.

In addition, mixtures of suitable monomers should give similar results. The monomers may be premixed or they may be introduced into the vacuum chambers separately and mixed in the chamber. For example, a mixture of an organo-metallic indium compound and an organo-metallic tin compound should result in a transparent conductive coating of indiumtin oxide in relatively the same proportion as the indium and tin compounds were in the original mixture in the chamber.

It should also be noted that while the process of the present invention is particularly advantageous with regard to plastic substrates which cannot withstand extreme heat, it may also be applied to suitable ceramic substrates, i.e., glass, silicon or germanium, for example. Successful coatings have been produced in substrates of glass, germanium and saphire.

One of the great advantages of the process of the present invention lies in the fact that the highly conductive, transparent coatings can be uniformly deposited without any heating of the substrates and this can be done in vacuum chambers which are merely roughed out with mechanical pumps. This means, of course, that the critical parameters associated with prior art systems have been eliminated.

As explained above, the coating process of the present invention can be maintained without heating of the substrate. This is accomplished, by controlling the input power density of the RF system to a fairly low wattage, normally below 2 watts per square inch. This power is sufficient to provide an excellent rate of deposition of the metallic oxide desired and yet is low enough to prevent any damage to the substrate by excessive heating.

The embodiments of the invention in which an exclusive property or right is claimed are defined as follows:

1. A method of depositing an optically transparent, electrically conductive thin film metal oxide coating on an unheated substrate comprising the steps of:
   positioning said substrates on a grounded support within a glow discharge chamber;
   partially evacuating said chamber;
   establishing an atmosphere in said chamber said atmosphere comprising an organo-metallic compound and oxygen, wherein said organo-metallic compound is one selected from the group M-R, wherein M is a metal selected from the group consisting of tin, indium, cadmium, and rhenium and R is an alkyl group having 1–4 carbon atoms;
   establishing a glow discharge in said chamber by the use of an AC, DC or RF source;
   controlling the power of said glow discharge such that the temperature of the substrate remains at a point below that at which it is affected by temperature; and
   maintaining said glow discharge until the film thereby deposited on said substrate reaches the desired thickness.

2. The method of claim 1 wherein said organo-metallic compound contains a methoxy group.

3. The method of claim 1 wherein said substrate is a plastic material.

4. The method of claim 3 wherein said substrate comprises an optically transparent polycarbonate or polyimide polymer.

5. The method of claim 1 wherein said organo-metallic compound is one selected from the group consisting of tetramethyltin and tetraethyltin.

* * * * *